United States Patent [19]
Chao et al.

[11] Patent Number: 5,622,899
[45] Date of Patent: Apr. 22, 1997

[54] METHOD OF FABRICATING SEMICONDUCTOR CHIPS SEPARATED BY SCRIBE LINES USED FOR ENDPOINT DETECTION

[75] Inventors: Ying-Chem Chao, Ming-Hsiang; Chin-Heng Shen, Hsin-Chu, both of Taiwan

[73] Assignee: Taiwan Semiconductor Manufacturing Company Ltd., Hsin-Chu, Taiwan

[21] Appl. No.: 635,828

[22] Filed: Apr. 22, 1996

[51] Int. Cl.$^6$ .................................................. H01L 21/301
[52] U.S. Cl. .............................. 438/9; 438/462; 438/941; 438/637
[58] Field of Search ...................................... 437/226, 227, 437/228 ES, 228 MRK; 148/DIG. 28

[56] References Cited

U.S. PATENT DOCUMENTS

| | | | |
|---|---|---|---|
| 5,017,512 | 5/1991 | Takagi | 437/226 |
| 5,132,252 | 7/1992 | Shiraiwa et al. | 148/DIG. 28 |
| 5,136,354 | 8/1992 | Morita et al. | 437/226 |
| 5,234,868 | 8/1993 | Cote | 437/225 |
| 5,290,711 | 3/1994 | Yanagisawa | 437/20 |
| 5,462,636 | 10/1995 | Chen et al. | 437/227 |
| 5,472,895 | 12/1995 | Park | 437/44 |

FOREIGN PATENT DOCUMENTS

| | | |
|---|---|---|
| 62-265727 | 11/1987 | Japan . |
| 4030522 | 2/1992 | Japan . |
| 5121561 | 5/1993 | Japan . |

*Primary Examiner*—Michael Trinh
*Attorney, Agent, or Firm*—George O. Saile

[57] ABSTRACT

A process has been developed in which photoresist thinning at the edges of silicon chips, resulting from photoresist flowing from semiconductor chips, exhibiting features with raised topographies, to flat scribe regions, has been reduced. The reduction in photoresist flowing has been accomplished by creating a chessboard pattern of raised insulator and metal features, in the scribe line region, thus reducing the differences in topography between the scribe line and chip regions. The areas between the raised mesas, in the scribe line regions, are used for laser or optical endpoint detection of RIE processes.

18 Claims, 5 Drawing Sheets

METHOD OF FABRICATING SEMICONDUCTOR CHIPS SEPARATED BY SCRIBE LINES USED FOR ENDPOINT DETECTION

BACKGROUND OF THE INVENTION

1. Field of the Invention

The present invention relates to fabrication techniques use to produce semiconductor integrated circuits, and more specifically to a process used to create an area on a semiconductor wafer, to be used for a scribe line.

2. Description of Prior Art

Semiconductor devices, used for logic and memory applications, are fabricated on areas of a semiconductor, or a silicon wafer, in repeating patterns. The individual patterns, containing the desired memory and logic devices, are then separated into individual silicon chips, each chip possessing the desired logic and memory design. The number of silicon chips obtained from a single silicon wafer is a function of the size of the starting wafer, as well as the size of the individual silicon chip. The separation into individual silicon chips is usually accomplished by cutting or scribing the silicon wafer, in designated regions of the wafer, located between the repeating device patterns, via use of mechanical or laser apparatus. The regions, designated as areas to be used for scribing, are usually referred to as scribe lines, or kerf regions.

Since the separation into individual silicon chips occurs only at the completion of device fabrication process, the scribe line areas can be used for test sites or end point detection sites, needed for evaluation of the health of the ongoing semiconductor wafer. Since these test sites, or end point detection sites do not provide any additional function at the completion of the fabrication process for semiconductor devices, destruction of the test sites or end point detection sites, during the scribe process, occur without consequence. An example of the usefulness of the scribe line area, during the ongoing fabrication sequence, is the use of this area for reactive ion etching, (RIE), end point detection. When patterning specific materials used for fabrication of silicon devices, reactive ion etching techniques are employed to create a desired pattern, of a specific material, on the evolving silicon chip. First a photoresist pattern is used as a mask, followed by RIE processing which transfers the overlying photoresist pattern to the underlying, specific material. In most cases photoresist masking does not cover the scribe line area, therefore the specific material in the scribe line area, is completely removed during the RIE procedure. The end point, or the point in which the specific material has been removed, is extremely important, allowing the RIE process to be terminated, at a point in which other materials, underlying the specific material being etched, is not adversely affected. End point detection is accomplished via detection of the underlying materials or the specific material being etched. The acuity or sharpness of the endpoint is increased with increasing surface areas, thus making the large area of scribe lines, a valuable area for successful semiconductor device fabrication processing.

Although the use of scribe lines, clear of material used to fabricate the desired silicon chips, allows sharper end point detection to occur, the removal of materials from the scribe line regions, can have a adverse effect on subsequent processing steps. The topography of the area used for creation of the silicon chip, contains patterns, and regions, raised by the build up of metal and insulator layers. In contrast, the scribe line regions, where an absence of these metal and insulator layers, results in a flat, and lower topography then the adjacent regions used for the fabrication of the silicon chips. The sharp contrast in the height of these two regions can result in the masking photoresist flowing into the lower scribe line regions, at the expense of the silicon device region. This phenomena can result in insufficient photoresist coverage of areas used for silicon devices, sometimes resulting in severe photoresist thinning at the edges of silicon device regions, near the lower scribe line areas. The thinner photoresist, when used as a mask to transfer a desired pattern to an underlying material, during a RIE procedure, may not provide the necessary protection, thus resulting in unwanted, deleterious RIE etching in areas of the silicon device, not designed for patterning.

Various inventions, such as Chen, et al, in U.S. Pat. No. 5,462,636, and Yanagisawa, in U.S. Pat. No. 5,290,711, address scribe line processing, however they do not teach the process described in this invention. This invention will illustrate a scribe line design, allowing specific areas of the scribe line region to be used for end point detection, while other areas of the scribe line region will be formed with a raised topography, in a chessboard pattern, reducing the possibility of photoresist flowing away from silicon device regions. This chessboard, or alternating regions of high and low topography areas is created by specific scribe line designs.

SUMMARY OF THE INVENTION

It is an object of this invention to form masking photoresist patterns, with uniform thickness across the semiconductor wafer, avoiding photoresist thinning at the edges of silicon chips, near the scribe lines.

It is another object of this invention to provide scribe line patterns, with topographies similar to topographies exhibited in the semiconductor chip region, to avoid photoresist flowing into the scribe line regions.

It is yet another object of this invention to use a chessboard scribe line pattern that provides regions of raised topography, needed to prevent photoresist flowing from the semiconductor region to the scribe line region, and also to provide other scribe line regions, with flat topography, needed for RIE end point detection.

In accordance with the present invention a process for fabricating semiconductor chips, separated by scribe lines that exhibit a chessboard pattern of raised and flat topographies, is described. After formation of repeating transfer gate transistor cells, configuring the semiconductor chip region, separated by clear scribe line regions, a first insulator layer is deposited. Photoresist and RIE patterning, used to form contact hole openings in the first insulator layer, to transfer gate transistor regions of the semiconductor chip, also create a chessboard pattern of first insulator mesas, on the semiconductor substrate, in an area of the scribe line region that will be used for insulator, RIE endpoint detection. A first metallization layer is deposited and patterned using photoresist and RIE procedures, to create a first metal structure in the semiconductor chip region, while also forming a chessboard pattern of first metal mesas, on a field oxide layer, in an area of the scribe line region that will be used for metal, RIE endpoint detection. A second insulator layer is deposited, followed by photoresist and RIE patterning, creating a via hole to the underlying first metal structure, in the semiconductor chip region. The patterning also forms a second insulator mesa, directly overlying the chessboard pattern of first insulator mesas, in the area of the scribe line region used for insulator, RIE endpoint detection. A second metallization layer is deposited and patterned, using photoresist and RIE procedures, creating a second metal structure in the semiconductor chip region. The patterning also forms a second metal mesa, directly overlying the chessboard pattern of first metal mesas, in the scribe line region, used for metal, RIE endpoint detection. This sequence of forming upper level vias and metal structures, in the semiconductor chip region, while forming insulator and metal mesas, on the underlying chessboard patterns, in the scribe line region, is repeated for subsequent wiring levels. Photoresist thinning due to uneven topographies is avoided due to the topography created in the scribe line regions.

BRIEF DESCRIPTION OF THE DRAWINGS

The object and other advantages of this invention are best described in the preferred embodiment with reference to the attached drawings that include:

FIGS. 2a–5a, schematically showing the stages of fabrication, used to create metal wiring levels for a semiconductor chip.

FIGS. 2b–5b, schematically indicating the stages of fabrication used to create flat and raised topographies, for the scribe line region, between semiconductor chips.

DESCRIPTION OF THE PREFERRED EMBODIMENTS

Figure 1:
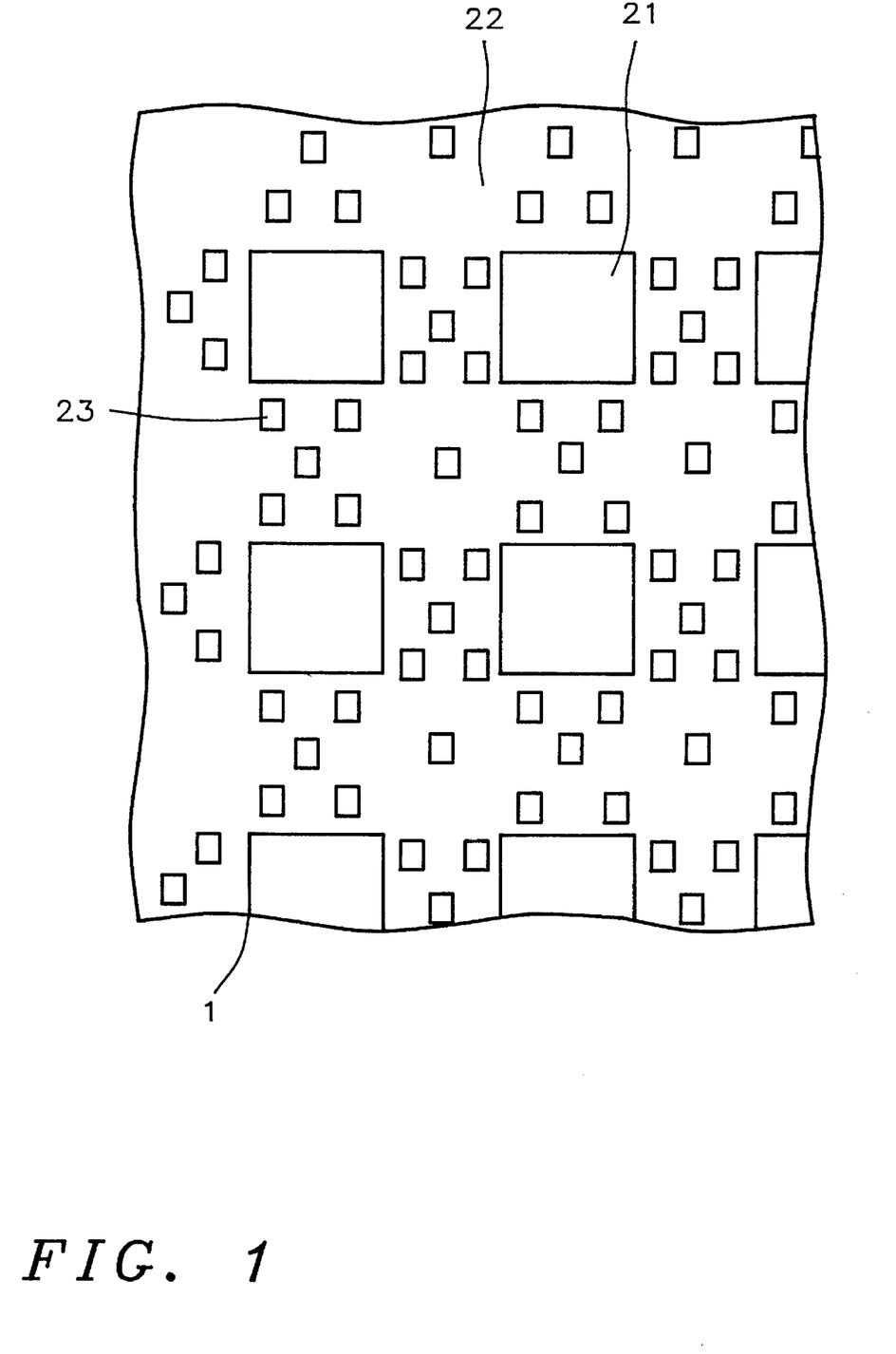
FIG. 1, schematically showing semiconductor chip areas, separated by scribe line regions that consist of flat topography, used for RIE endpoint detection, as well as raised structures, used to avoid photoresist flowing.

The method of fabricating semiconductor chips, separated by scribe lines exhibiting both flat topographies, for RIE endpoint detection, and raised topographies, for optimized photoresist coverage, will now be described. FIG. 1, schematically shows the layout of semiconductor chips, 21, to be formed on semiconductor substrate, 1. The areas between semiconductor chips, 21, is used as the scribe line region, 22. Since the scribe line region, 22, will be destroyed during the dicing operation, at the completion of the fabrication process, the region is usually used for RIE, endpoint detection purposes. For example if a via hole is being created in an insulator layer of a device region of semiconductor chip, 21, the identical removal of the insulator layer from the scribe line regions, 22, can be detected by laser procedures. The sharpness of the detection is enhanced by the large surface area of the scribe line region, 22. RIE endpoint detection for metal structure formation, can also be monitored using laser techniques in the scribe line region, 22. However complete removal of both insulator and metal layers from the scribe line regions only, while the same insulator and metal layers are patterned to create raised structures in the semiconductor chip region, 21, result in uneven topographies for the regions. The consequence of flat topographies for scribe line regions, 22, is photoresist flowing from the higher topographies in the semiconductor chip regions, 21, to the lower scribe line regions, 22, during the photoresist application procedure. This results in severe thinning of photoresist at the edges of the semiconductor chip region, 21, to an extent in which a sufficient thickness of photoresist is not present to provide the needed masking functions, during RIE procedures. Therefore a process has been developed in which scribe line regions, 22, will be comprised of flat regions, used for RIE endpoint detection purposes, and of raised mesas, 23, to be used to provide topographies similar to topographies experienced in the semiconductor chip region, enabling the photoresist flowing phenomena to be avoided.

Figure 2A:
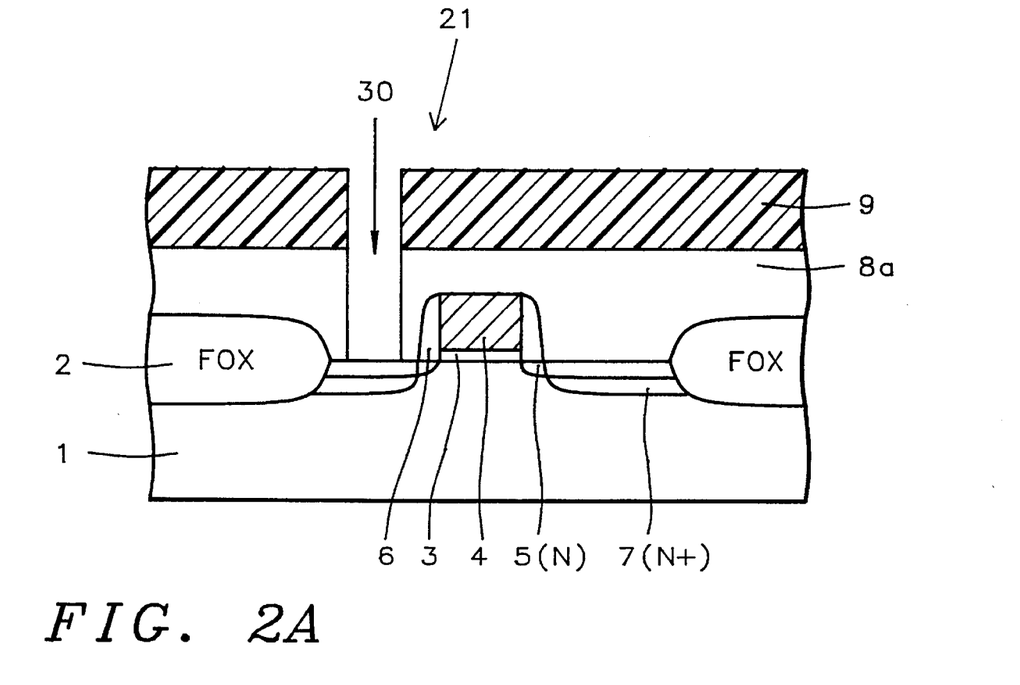
Figure 2B:
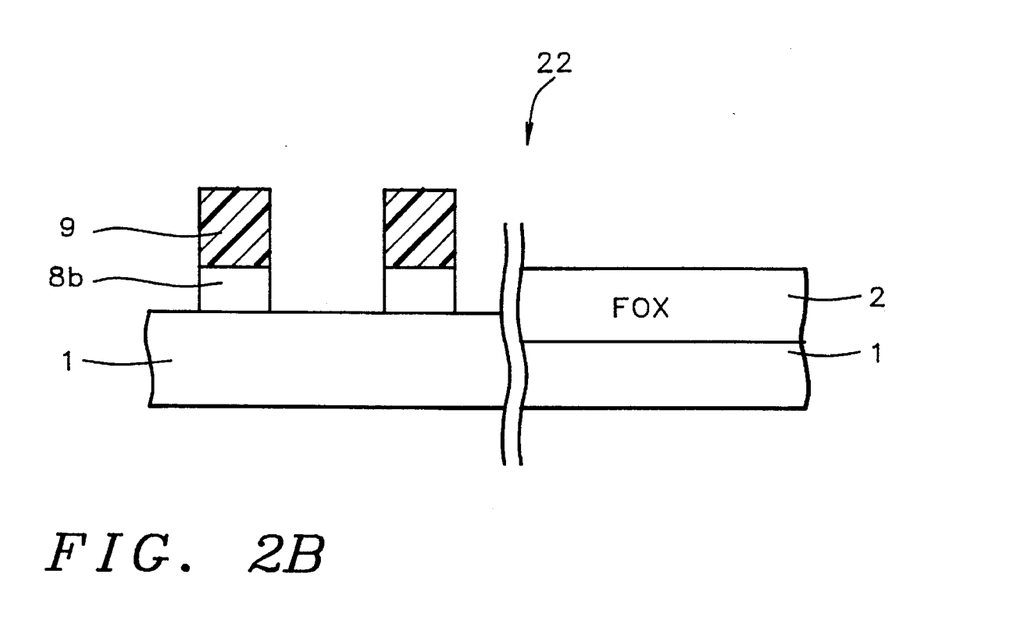

FIG. 2a and FIG. 2b, show the fabrication stages used to create the transfer gate transistors, used for the semiconductor chip, 21, while also creating the scribe line regions, 22, used for RIE endpoint detection purposes. This invention can be used for all metal oxide semiconductor field effect transistor, (MOSFET), technologies, such as N channel, (NFET), devices, P channel, (PFET), devices, complimentary, (CMOS), devices, or bipolar-CMOS, (BiCMOS), devices, however for this invention the NFET process will be the process this invention will be applied to. A substrate, 1, composed of P type, single crystalline silicon, with a <100> crystallographic orientation, is used and shown schematically in FIGS. 2a and 2b. Field oxide regions, 2, (FOX), are formed in desired regions of the semiconductor chip, 22, of FIG. 2a, and scribe line regions, 22, of FIG. 2b. The FOX regions are formed by photoresist and RIE patterning of a composite insulator layer, consisting of an overlying layer of silicon nitride, on an underlying silicon oxide layer. After removal of the photoresist layer, using plasma oxygen ashing, followed by careful wet cleans, the FOX region, 2, is formed in regions not covered with the composite insulator, oxidation mask, via thermal oxidation in an oxygen—steam ambient, at a temperature between about 850° to 1050° C., to a thickness between about 3000 to 5000 Angstroms. The composite insulator layer is removed via a hot phosphoric acid solution for the silicon nitride layer, while a buffered hydrofluoric acid solution is used to remove the underlying silicon oxide layer. The FOX regions are used to isolate the subsequent device regions, for semiconductor chip, 21, shown in FIG. 2a, while FIG. 2b, indicates scribe line region, 22, using FOX region, 2, as an underlay for areas to be used for laser endpoint detection, for RIE metal operations, however not present for scribe line regions used for insulator, RIE endpoint detection.

The fabrication of the transfer gate transistor, of semiconductor chip, 21, shown in FIG. 2a, continues with the growth of a silicon dioxide layer, 3, used as a gate insulator, via thermal oxidation in an oxygen—steam ambient, at a temperature between about 800° to 1000° C., to a thickness between about 50 to 300 Angstroms. Next a layer of polysilicon is deposited using low pressure chemical vapor deposition, (LPCVD), procedures, at a temperature between about 500° to 800° C., to a thickness between about 1500 to 4500 Angstroms. The polysilicon layer can be deposited intrinsically and doped via ion implantation of phosphorous or arsenic, at an energy between about 30 to 100 KeV, at a dose between about 5E13 to 5E15 atoms/cm$^2$. The polysilicon layer can also be deposited using insitu doping procedures, by the addition of either phosphine or arsine to a silane ambient. Conventional photoresist and RIE procedures, using $Cl_2$ as an etchant, are used to create polysilicon gate structure, 4, schematically shown for semiconductor chip, 21, in FIG. 2a. The polysilicon layer was also deposited on scribe line regions, 22, but was completely removed by the unmasked, RIE procedure. Photoresist removal is accomplished via plasma oxygen ashing and careful wet cleans. A lightly doped source and drain region, 5, is formed in the semiconductor chip, 21, shown in FIG. 2a, via ion implantation of phosphorous, at an energy between about 30 to 70 KeV, at a dose between about 1E12 to 5E13 atoms/cm$^2$. This implantation is also performed in scribe line regions, not covered with FOX, 2, and used for insulator, RIE endpoint detection purposes, however this is not shown in FIG. 2b. A silicon oxide layer is next deposited, using either LPCVD or plasma enhanced chemical vapor deposition, (PECVD), procedures, at a temperature between about 400° to 800° C., to a thickness between about 1500 to 4000 Angstroms, using tetraethylorthosilicate, (TEOS), as a source. An anisotropic, RIE procedure, using $CHF_3$ as an etchant, is used to create insulator sidewall spacer, 6, shown schematically in FIG. 2a. This RIE procedure also removes the silicon oxide layer from scribe line regions, 22, shown in FIG. 2b, and it also removes silicon dioxide layer, 3, from the surface of the scribe line regions, not covered by FOX, 2. A heavily doped source and drain region, 7, is next formed for the transfer gate transistor, shown in FIG. 2a, via ion implantation of arsenic, at an energy between about 50 to 100 KeV, at a dose between about 5E13 to 5E15 atoms/cm². This procedure also implants arsenic into scribe line regions, not covered by FOX, 2, used for insulator, RIE endpoint detection purposes, however not shown in FIG. 2b.

A first insulator layer, 8a, of boro-phosphosilicate, (BPTEOS), using TEOS as a source for the silicon oxide portion of the BPTEOS layer, is next deposited using either LPCVD or PECVD processing, at a temperature between about 350° to 500° C., to a thickness between about 5000 to 15000 Angstroms. A photoresist pattern, 9, is used as a mask to define contact hole, 30, in the semiconductor chip, 21, shown schematically in FIG. 2a. Contact hole, 30, was created via RIE etching, using $CHF_3$ as an etchant. Photoresist pattern, 9, is also used, along with RIE etching, using $CHF_3$, to create silicon oxide mesas, 8b, for the section of the scribe line region, 22, used for insulator, RIE endpoint detection purposes. This is shown schematically in FIG. 2b. During the RIE procedure, when silicon oxide, 8a, is removed from between silicon oxide mesas, 8b, a component, a reaction product of the etch, CO or $CO_2$, ceases to evolve, and is not observed by the endpoint apparatus, indicating endpoint. The large area of silicon now exposed in the scribe line region, 22, at endpoint, results in a sharp detection signal. In addition the silicon oxide mesas formed in photoresist protected area of scribe line region, 22, will provide the needed topography in the scribe line region, that will be needed to prevent subsequent photoresist flowing problems. Therefore the chessboard pattern of silicon mesas, for topography purposes, and flat regions, for endpoint detection purposes, is achieved. Silicon oxide layer, 8a, also deposited on FOX region, 2, in scribe line region, 22, was totally removed during the $CHF_3$, RIE procedure. This section of the scribe line region will be used for metal, RIE endpoint detection purposes. Photoresist pattern, 9, is removed using plasma oxygen ashing and careful wet cleans.

Figure 3A:
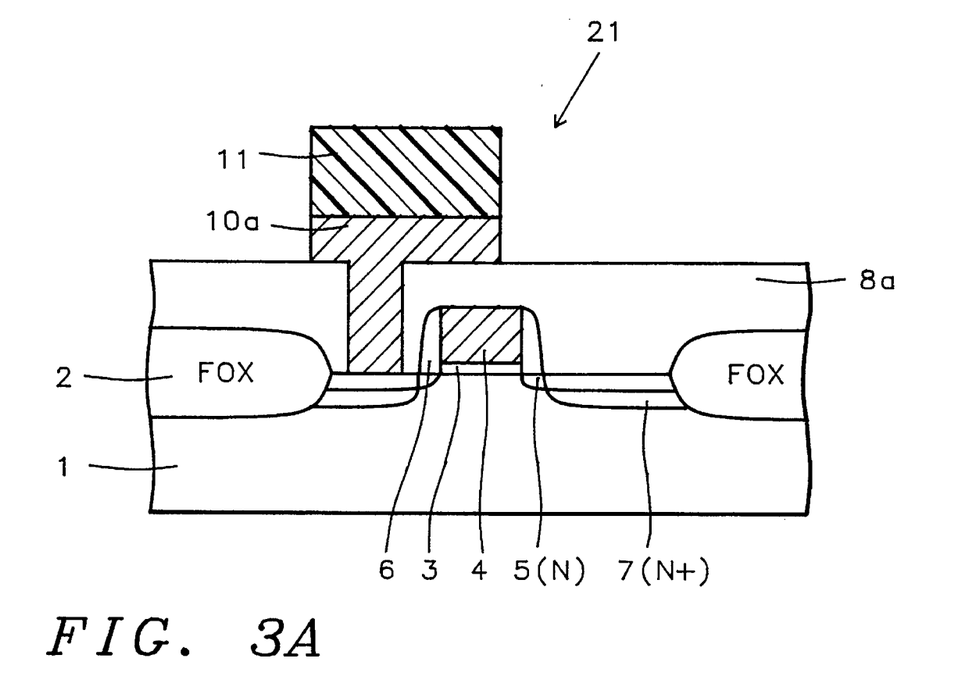
Figure 3B:
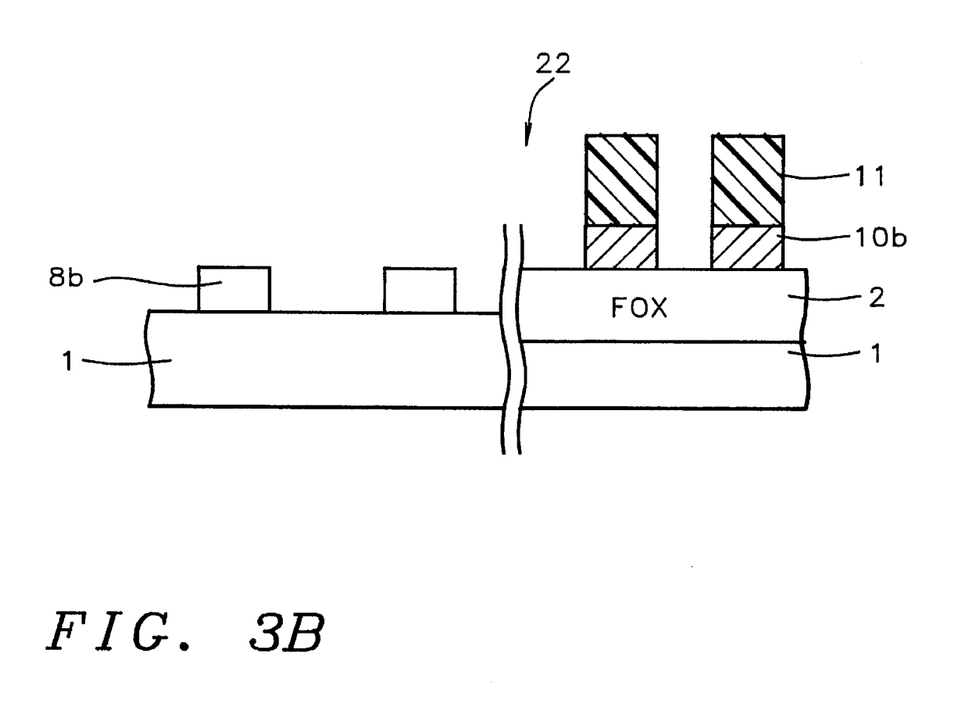

A first metallization layer of aluminum, containing between about 1 to 3% copper, and between about 0 to 2.0% silicon, is deposited using r.f. sputtering procedures, to a thickness between about 4000 to 9000 Angstroms. A photoresist pattern 11, is used, along with a RIE procedure, using $Cl_2$ as an etchant, to define first level metal structure, 10a, for the semiconductor chip, 21, shown schematically in FIG. 3a. Photoresist pattern, 11, is also used to allow the creation of first level metal mesas, 10b, for the scribe line region, 22, used for metal, RIE endpoint detect purposes, shown schematically in FIG. 3b. The large area of FOX region, 2, exposed at the completion of metal removal, between photoresist protected mesas, allows for a sharp endpoint signal to be obtained. Endpoint detection senses an absence of metal, indicating complete metal removal. In addition the topography created by first level metal mesas, 10b, using a chessboard pattern of metal mesas and flat areas, in scribe line region, 22, will again, as was the case previously with silicon oxide mesas, 8b, prevent subsequent photoresist flowing problems. Photoresist pattern, 11, is removed via plasma oxygen ashing, followed by careful wet cleans.

Figure 4A:
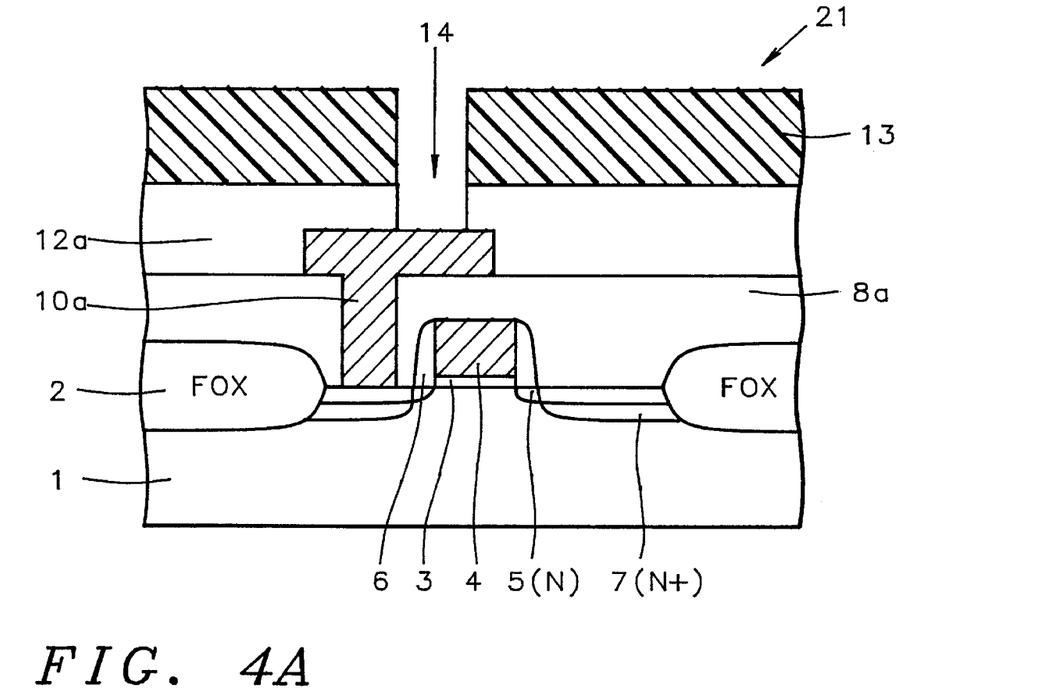
Figure 4B:
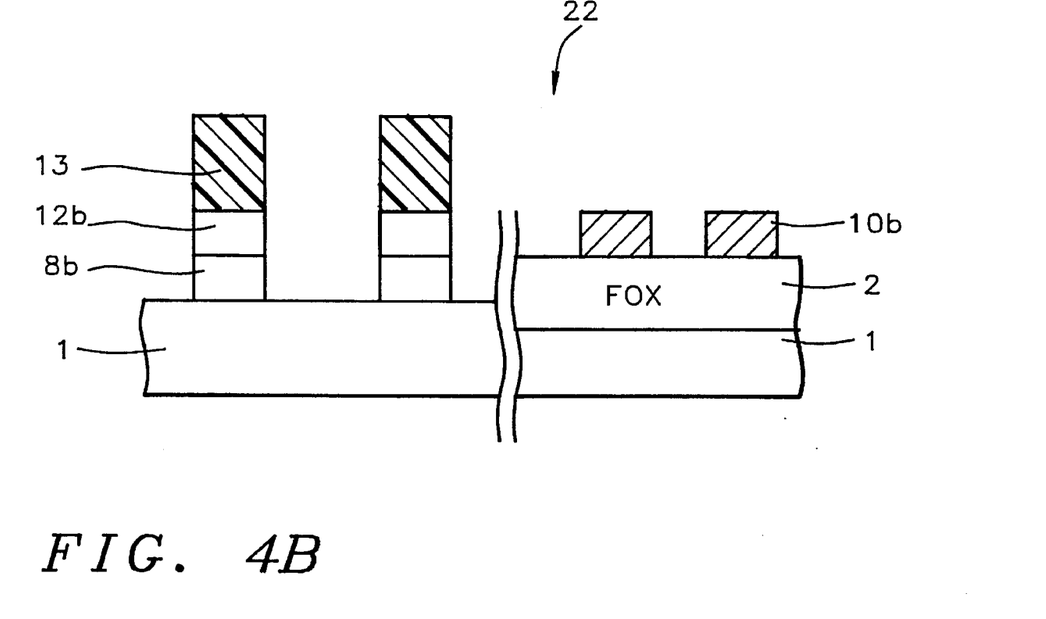

A second insulator layer, 12a, of silicon oxide, is deposited, using PECVD procedures, at a temperature between about 300° to 500° C., to a thickness between about 2000 to 5000 Angstroms. A photoresist pattern, 13, is used along with RIE procedures, again using $CHF_3$ as an etchant, to produce via hole, 14, for the semiconductor chip area, 21, shown schematically in FIG. 4a. Photoresist pattern 13, is also used as a mask to create silicon oxide mesas, 12b, via $CHF_3$ RIE procedures, for the section of scribe line region, 22, used for insulator endpoint detection. Again, as was the case previously described for silicon oxide mesas 8b, the large area of silicon exposed between silicon oxide mesas, result in a sharp endpoint signal. In addition the topography now created, consisting of flat regions, and thicker, combined silicon oxide mesas, provide the needed topography to avoid photoresist flowing from subsequent resist applications. Second insulator layer, 12a, was completely removed from the scribe line region, used for metal, endpoint detection purposes. Photoresist pattern, 13, is once again removed using plasma oxygen ashing, followed by careful wet cleans.

Figure 5A:
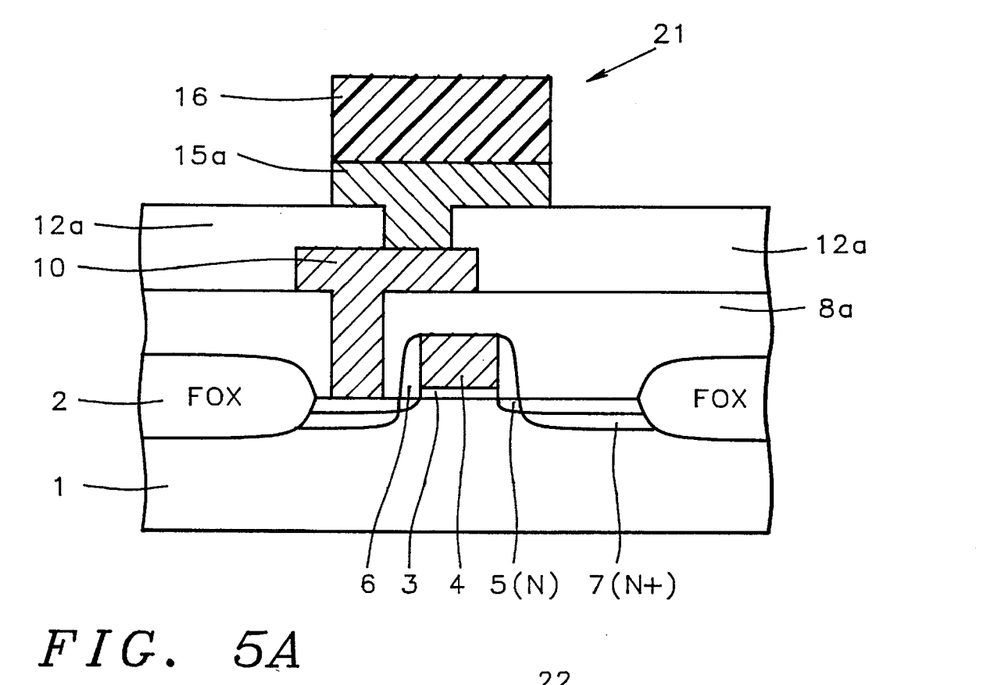
Figure 5B:
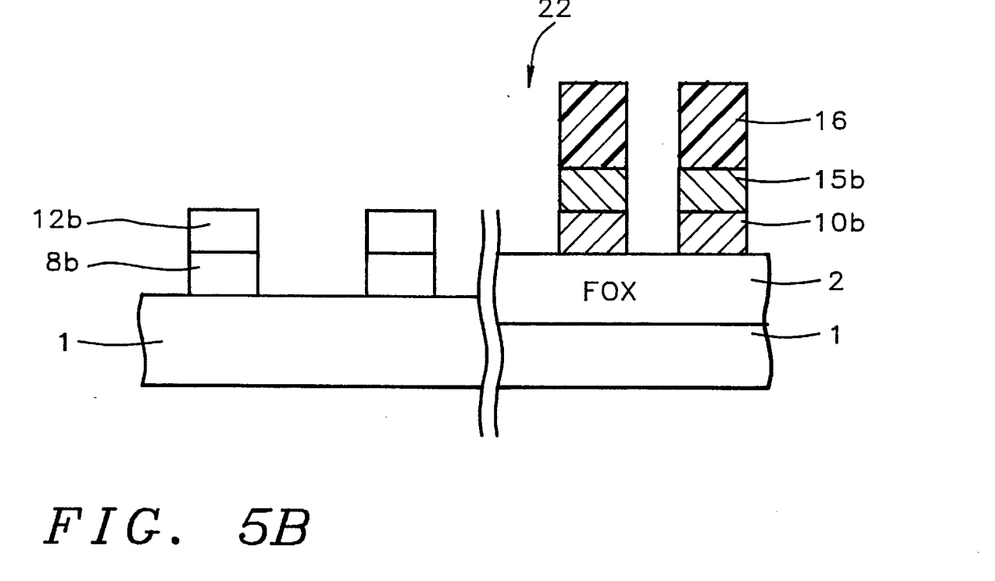

A second metallization layer of aluminum, containing between about 1 to 3% copper, is deposited using r.f. sputtering procedures, to a thickness between about 4000 to 9000 Angstroms. A photoresist pattern, 16, along with RIE processing, using $Cl_2$ as an etchant, allow the creation of second level metal structure, 15a, in the semiconductor chip region, 21, shown schematically in FIG. 5a. Photoresist pattern, 16, along with $Cl_2$ RIE processing, is also used to create second level metal mesas, 15b, in scribe line region, 22, used for metal, RIE endpoint detection purposes, and shown schematically in FIG. 5b. The chessboard pattern of flat regions, used for endpoint detection purposes, and thick metal mesas, formed by overlying second level metal mesa, 15b, on first level metal mesa, 10b, create the topography needed to prevent subsequent photoresist applications from flowing away from raised topographies, such as in semiconductor chip region, 21, to flatter scribe line regions. Second level metallization layer, 15a, is completely removed from the scribe line region, used for insulator, RIE endpoint detection purposes. Photoresist pattern, 16, is removed using plasma oxygen ashing, and wet clean procedures.

This process of creating scribe line regions with in an alternating, or chessboard pattern, of flat regions for end point detection purposes, and raised regions, resulting in the desired topography needed to prevent photoresist flowing, can be extended through upper levels of metallization and insulation, using the identical process steps just described for the lower two levels.

While this invention has been particularly shown and described with reference to, the preferred embodiments thereof, it will be understood by those skilled in the art that various changes in form and details may be made without departing from the spirit and scope of this invention.

What is claimed is:

1. A method of fabricating a plurality of regions, containing semiconductor devices, on a semiconductor substrate, using scribe line regions between said regions, comprising the steps of:

providing transfer gate transistors on said regions, containing said semiconductor devices;

deposition of a first insulator layer on said regions, containing said semiconductor devices, and on said scribe line regions;

patterning said first insulator layer to open a contact hole in said first insulator layer, to an element in said regions containing semiconductor devices, and to form first insulator mesas, in a first area of said scribe line regions;

deposition of a first metallization layer on said regions and in said contact hole, containing said semiconductor devices, and on said scribe line regions;

patterning said first metallization layer to form a first level metal structure on said regions and in said contact hole, containing said semiconductor devices, and to form first metal mesas, in a second area of said scribe line regions;

deposition of a second insulator layer on said regions and on said first level metal structure, containing said semiconductor devices, and on said scribe regions including said first insulator mesas;

patterning said second insulator layer to open a via hole in said second insulator layer, to expose top surface of said first level metal structure, in said regions, containing said semiconductor devices, and to form second insulator mesas, overlying said first insulator mesas, in said first area of said scribe line regions;

deposition of a second metallization layer on said regions, containing said semiconductor devices, and on said scribe line regions; and patterning said second metallization layer to form a second level metal structure on said regions and in said via hole, containing said semiconductor devices, and to form second metal mesas, overlying said first metal mesas, in said second area of said scribe line regions.

2. The method of claim 1, wherein said first insulator layer is a boro-phosphosilicate layer, deposited using LPCVD or PECVD processing, at a temperature between about 350° to 500° C., to a thickness between about 5000 to 15000 Angstroms, using tetraethylorthosilicate, (TEOS), phosphine and diborane.

3. The method of claim 1, wherein said patterning, used to open said contact hole in said first insulator layer, on said regions, containing said semiconductor devices, and also used to create said first insulator mesas, in said first area of said scribe line regions, is performed via RIE processing, using $CHF_3$ as an etchant, and using said first area of said scribe line regions, for laser endpoint detection of insulators.

4. The method of claim 1, wherein said first metallization layer is aluminum, containing between about 1 to 3% copper, and between 0 to 2% silicon, is deposited using r.f. sputtering procedures, to a thickness between about 4000 to 9000 Angstroms.

5. The method of claim 1, wherein said patterning, used to form said first level metal structure, on said regions, containing said semiconductor devices, and also used to create said first metal mesas, in said second area of said scribe line regions, is performed via RIE processing, using $Cl_2$ as an etchant, and using said second area, of said scribe line regions, for laser or optical endpoint detection of metals.

6. The method of claim 1, wherein said second insulator layer is silicon oxide, deposited using PECVD processing, at a temperature between about 300° to 500° C., to a thickness between about 2000 to 5000 Angstroms.

7. The method of claim 1, wherein said patterning, used to open said via hole in said second insulator layer, on said regions, containing said semiconductor devices, and also used to create said second insulator mesas, overlying said first insulator mesas, in said first area of said scribe line regions, is performed via RIE processing, using $CHF_3$ as an etchant, and using said first area, of said scribe line regions, for laser or optical endpoint detection of insulators.

8. The method of claim 1, wherein said second metallization layer is aluminum, containing between about 1 to 3% copper, deposited using r.f. sputtering procedures, to a thickness between about 4000 to 9000 Angstroms.

9. The method of claim 1, wherein said patterning, used to create said second level metal structure, on said regions, containing said semiconductor devices, and also used to create said second metal mesas, overlying said first metal mesas, in said second area, of said scribe line regions, is performed via RIE processing, using $Cl_2$ as an etchant, and using said second area, of said scribe line regions, for laser or optical endpoint detection of metals.

10. A method of fabricating semiconductor chips and scribe lines, between said semiconductor chips, on a semiconductor substrate, with scribe line regions comprised of a chessboard pattern of flat regions, used for insulator and metal, RIE endpoint detection sites, and raised insulator and metal mesas, used to provide a topography for said scribe line regions, equivalent to the topography of said semiconductor chips, comprising the steps of:

providing transfer gate transistors on said semiconductor chips;

deposition of a first insulator layer on said semiconductor chips, and on said scribe line regions;

patterning said first insulator layer, using RIE processing, to open a contact hole in said first insulator layer, to an element in said semiconductor chips, and to form first insulator mesas, in an area of said scribe line regions, used for laser or optical endpoint detection of said first insulator layer RIE process;

deposition of a first metallization layer on said semiconductor chips and in said contact hole, and on said scribe line regions;

patterning said first metallization layer, using RIE processing, to form a first level metal structure on said semiconductor chips and in said contact hole, and to form first metal mesas, in an area of said scribe line regions, used for laser endpoint detection of said first metallization layer RIE process;

deposition of a second insulator layer on said semiconductor chips and on said first level metal structure, and on said scribe regions including said first insulator mesas;

patterning said second insulator layer, using RIE processing, to open a via hole in said second insulator layer, to expose top surface of said first level metal structure, on said semiconductor chips, and to form second insulator mesas, overlying said first insulator mesas, in said area of said scribe line regions, used for laser endpoint detection of said second insulator RIE process;

deposition of a second metallization layer on said semiconductor chips and in said via hole, and on said scribe line regions; and patterning said second metallization layer, using RIE processing, to form a second level metal structure on said semiconductor chips and in said via hole, and to form second metal mesas, overlying said first metal mesas, in said area of said scribe line regions, used for laser or optical endpoint detection of said second metallization RIE process.

11. The method of claim 10, wherein said first insulator layer is a boro-phoshosilicate layer, deposited using LPCVD or PECVD processing, at a temperature between about 350° to 500° C., to a thickness between about 5000 to 15000

Angstroms, using tetraethylorthosilicate, (TEOS), diborane and phosphine.

12. The method of claim 10, wherein said patterning, used to open said contact hole in said first insulator layer, on said semiconductor chips, and also used to create said first insulator mesas, in said area of said scribe line regions, used for laser endpoint detection of said first insulator layer RIE process, is performed using $CHF_3$ as an etchant.

13. The method of claim 10, wherein said first metallization layer is aluminum, containing between about 1 to 3% copper, and between about 0 to 2% silicon, deposited using r.f. sputtering procedures, to a thickness between about 4000 to 9000 Angstroms.

14. The method of claim 10, wherein said patterning, used to form said first level metal structure, on said semiconductor chips, and also used to create said first metal mesas, in said area of said scribe line regions, used for laser endpoint detection of said first metallization layer RIE process, is performed using $Cl_2$ as an etchant.

15. The method of claim 10, wherein said second insulator layer is silicon oxide, deposited using PECVD processing, at a temperature between about 300° to 500° C., to a thickness between about 2000 to 5000 Angstroms.

16. The method of claim 10, wherein said patterning, used to open said via hole in said second insulator layer, on said semiconductor chips, and also used to create said second insulator mesas, overlying said first insulator mesas, in said area of said scribe line regions, used for laser or optical endpoint detection of said second insulator layer RIE process, is performed using $CHF_3$ as an etchant.

17. The method of claim 10, wherein said second metallization layer is aluminum, containing between about 1 to 3% copper, is deposited using r.f. sputtering procedures, to a thickness between about 4000 to 9000 Angstroms.

18. The method of claim 10, wherein said patterning, used to create said second level metal structure, on said semiconductor chips, and also used to create said second metal mesas, overlying said first metal mesas, in said area of said scribe line regions, used for laser or optical endpoint detection of said second metallization layer RIE process, is performed using $Cl_2$ as an etchant.

* * * * *

UNITED STATES PATENT AND TRADEMARK OFFICE
CERTIFICATE OF CORRECTION

PATENT NO. : 5,622,899
DATED : April 22, 1997
INVENTOR(S) : Ying-Chen Chao
Chin-Heng Shen It is certified that error appears in the above-indentified patent and that said Letters Patent is hereby corrected as shown below: Title page:

Item (75), correct inventor's name from "Ying-Chem Chao" to --Ying-Chen Chao-- correct inventor's town from "Ming-Hsiang" to --Hsin-Chu, Taiwan--

Signed and Sealed this

Twenty-sixth Day of August, 1997

Attest:

Attesting Officer

BRUCE LEHMAN

Commissioner of Patents and Trademarks